United States Patent
Lee et al.

(10) Patent No.: US 10,559,331 B2
(45) Date of Patent: *Feb. 11, 2020

(54) MEMORY DEVICE AND METHOD OF OPERATING THE SAME

(71) Applicant: SK hynix Inc., Icheon-si, Gyeonggi-do (KR)

(72) Inventors: Hee Youl Lee, Icheon-si (KR); Sung In Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,264

(22) Filed: Jun. 14, 2019

(65) Prior Publication Data

US 2019/0304515 A1   Oct. 3, 2019

Related U.S. Application Data

(63) Continuation of application No. 15/789,640, filed on Oct. 20, 2017, now Pat. No. 10,410,692.

(30) Foreign Application Priority Data

Feb. 28, 2017   (KR) .......................... 10-2017-0025935

(51) Int. Cl.
   *G11C 7/06*   (2006.01)
   *G11C 7/10*   (2006.01)
   (Continued)

(52) U.S. Cl.
   CPC ............ *G11C 7/1006* (2013.01); *G11C 16/08* (2013.01); *G11C 16/10* (2013.01);
   (Continued)

(58) Field of Classification Search
   CPC ....... G11C 7/1006; G11C 16/08; G11C 16/10; G11C 16/3459; G11C 7/1096; G11C 16/0483
   (Continued)

(56) References Cited

U.S. PATENT DOCUMENTS

2006/0018162 A1*   1/2006   Kawai .................... G11C 16/12
                                                               365/185.28
2017/0287561 A1   10/2017   Lee et al.

FOREIGN PATENT DOCUMENTS

KR   1020150015578 A   2/2015
KR   1020150033129 A   4/2015
KR   1020170094659 A   8/2017

* cited by examiner

*Primary Examiner* — Huan Hoang
(74) *Attorney, Agent, or Firm* — William Park & Associates Ltd.

(57) ABSTRACT

Provided herein may be a memory device and a method of operating the same. The memory device may include a memory block including a plurality of pages coupled to word lines, respectively, peripheral circuits configured to, during a program operation, perform program, verify, and discharge operations on memory cells coupled to a word line selected from among the word lines, and a control logic configured to control the peripheral circuits such that, during the discharge operation performed after the verify operation, word lines, included in a region in which the program operation has not completed, and word lines, included in a region in which the program operation has completed, among the word lines, are discharged at different times.

19 Claims, 16 Drawing Sheets

(51) Int. Cl.
  *G11C 16/08* (2006.01)
  *G11C 16/10* (2006.01)
  *G11C 16/34* (2006.01)
  *G11C 16/04* (2006.01)
(52) U.S. Cl.
  CPC ........ *G11C 16/3459* (2013.01); *G11C 7/1096* (2013.01); *G11C 16/0483* (2013.01)
(58) Field of Classification Search
  USPC .................................................. 365/189.07
  See application file for complete search history.

MEMORY DEVICE AND METHOD OF OPERATING THE SAME

CROSS-REFERENCE TO RELATED APPLICATION

The present application is a continuation application of U.S. Ser. No. 15/789,640, filed on Oct. 20, 2017, and claims priority under 35 U.S.C. § 119(a) to Korean patent application number 10-2017-0025935 filed on Feb. 28, 2017 in the Korean Intellectual Property Office, the entire disclosure of which is incorporated herein by reference.

BACKGROUND

1. Technical Field

Various embodiments of the present disclosure generally relate to a memory device and a method of operating the memory device.

2. Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. As the memory device having a 2D structure is reaching its physical scaling limit, semiconductor manufacturers are producing memory devices having a 3D structure that include memory cells vertically stacked on a semiconductor substrate.

SUMMARY

Various embodiments of the present disclosure are directed to a memory device and a method of operating the memory device, which can improve the reliability of the memory device.

An embodiment of the present disclosure may provide for a memory device. The memory device may include a memory block including a plurality of pages coupled to word lines, respectively, peripheral circuits configured to, during a program operation, perform program, verify, and discharge operations on memory cells coupled to a word line selected from among the word lines, and a control logic configured to control the peripheral circuits such that, during the discharge operation performed after the verify operation, word lines, included in a region in which the program operation has not completed, and word lines, included in a region in which the program operation has completed, among the word lines, are discharged at different times.

An embodiment of the present disclosure may provide for a method of operating a memory device. The method may include performing a verify operation by applying a verify voltage to a selected word line and by applying a pass voltage to unselected word lines, discharging word lines coupled to pages on which a program operation has completed, among the unselected word lines, and discharging word lines, included in a region in which the program operation has completed, and remaining word lines including the selected word line at different times.

DETAILED DESCRIPTION

Figure 1:
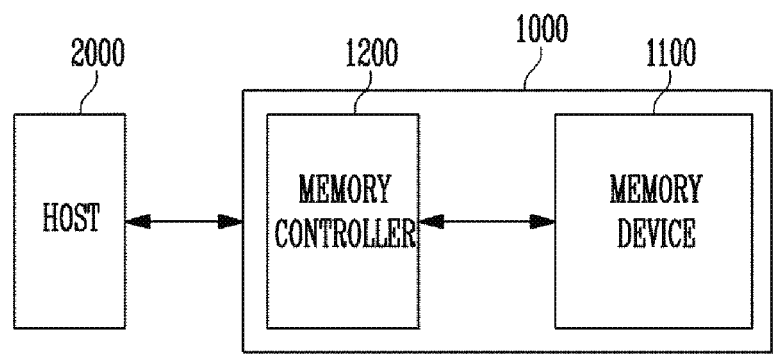
FIG. 1 is a diagram illustrating a memory system according to an embodiment of the present disclosure.

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, the element could be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising"

used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a memory system according to an embodiment of the present disclosure.

Referring to FIG. 1, a memory system 1000 may include a memory device 1100 for storing data and a memory controller 1200 for controlling the memory device 1100 under control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol provided for the purpose of data communication between the host 2000 and the memory system 1000 is not limited to the above examples and may be an interface protocol such as a Universal Serial Bus (USB), a Multi-Media Card (MMC), an Enhanced Small Disk Interface (ESDI), or Integrated Drive Electronics (IDE).

The memory controller 1200 may control overall operation of the memory system 1000 and may control data exchange between the host 2000 and the memory device 1100. For example, the memory controller 1200 may program or read data by controlling the memory device 1100 in response to a request from the host 2000. Further, the memory controller 1200 may store information of main memory blocks and sub-memory blocks included in the memory device 1100, and may select the memory device 1100 so that a program operation is performed on a main memory block or a sub-memory block depending on the amount of data that is loaded for the program operation. In an embodiment, the memory device 1110 may include a double data rate synchronous dynamic random access memory (DDR SDRAM), a low power DDR SDRAM fourth generation (LPDDR4 SDRAM), a graphics double data rate SDRAM (GDDR SDRAM), a low power DDR (LPDDR), a Rambus dynamic random access memory (RDRAM), or a flash memory.

The memory device 1100 may perform a program operation, a read operation, or an erase operation under control of the memory controller 1200.

Figure 2:
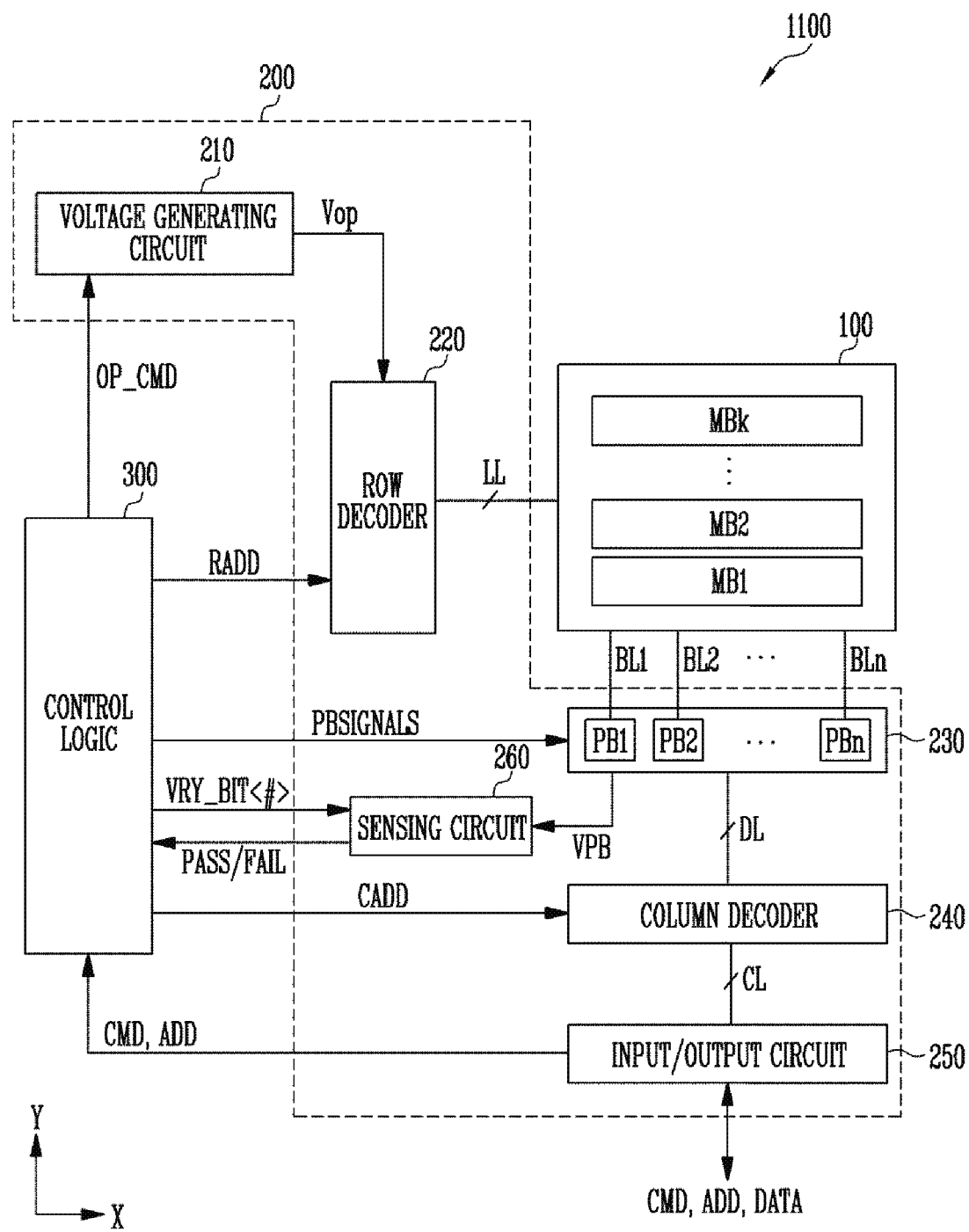
FIG. 2 is a diagram illustrating a memory device of FIG. 1.

FIG. 2 is a diagram illustrating the memory device of FIG. 1.

Referring to FIG. 2, the memory device 1100 may include a memory cell array 100, which stores data. The memory device 1100 may also include peripheral circuits 200, which perform a program operation for storing data in the memory cell array 100, a read operation for outputting stored data, and an erase operation for erasing stored data. The memory device 1100 may include a control logic 300, which controls the peripheral circuits 200 under control of a memory controller (e.g., 1200 of FIG. 1).

The memory cell array 100 may include a plurality of memory blocks MB1 to MBk (where k is a positive integer). Local lines LL and bit lines BL1 to BLn (where n is a positive integer) may be coupled to each of the memory blocks MB1 to MBk. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipelines. In accordance with an embodiment of the present disclosure, the word lines may be divided into a plurality of groups. In accordance with an embodiment of the present disclosure, during a verify operation or a read operation, the word lines may be sequentially discharged for respective groups.

The local lines LL may be coupled to the memory blocks MB1 to MBk, respectively, and the bit lines BL1 to BLn may be coupled in common to the memory blocks MB1 to MBk. The memory blocks MB1 to MBk may be implemented in a 2D or 3D structure. For example, in memory blocks having the 2D structure, pages may be horizontally arranged on a substrate. For example, in memory blocks having the 3D structure, pages may be vertically arranged on a substrate.

The peripheral circuits 200 may be configured to perform a program, read, or erase operation on a selected memory block under control of the control logic 300. For example, the peripheral circuits 200 may supply a verify voltage and a pass voltage to the first select line, the second select line, and the word lines, may selectively discharge the first select line, the second select line, and the word lines, and may verify memory cells coupled to a word line selected from among the word lines, under control of the control logic 300. In another example, the peripheral circuits 200 may be configured to perform program, verify, and discharge operations on memory cells coupled to a word line selected from among the word lines during a program operation. The peripheral circuits 200 may include a voltage generating circuit 210, a row decoder 220, a page buffer group 230, a column decoder 240, an input/output circuit 250, and a sensing circuit 260. Thus, in an embodiment, the control logic 300 may be configured to control the peripheral circuits 200 so that during the discharge operation performed after the verify operation, word lines in a region where the program operation has not completed and word lines in region where the program operation has completed, are discharged at different times.

The voltage generating circuit 210 may generate various operation voltages Vop used for program, read, and erase operations in response to an operation signal OP_CMD. Further, the voltage generating circuit 210 may selectively discharge the local lines LL in response to the operation signal OP_CMD. For example, the voltage generating circuit 210 may generate a program voltage, a verify voltage, a pass voltage, a read voltage, an erase voltage, a source line voltage, etc. under control of the control logic 300. For example, during the verify operation or the read operation, the voltage generating circuit 210 may control the source line voltage to be applied to the source lines and the pass voltage to be applied to the source select lines and the drain select lines, or may sequentially discharge the word lines for respective groups, under control of the control logic 300. For example, during the verify operation or the read operation, the voltage generating circuit 210 may discharge the selected word line at the same time that word lines belonging to a group including the selected word line are discharged, under control of the control logic 300.

The row decoder 220 may transfer the operating voltages Vop to the local lines LL coupled to the selected memory block in response to a row address RADD.

The page buffer group 230 may include a plurality of page buffers PB1 to PBn coupled to the bit lines BL1 to BLn. The page buffers PB1 to PBn may be operated in response to page buffer control signals PBSIGNALS. For example, the page buffers PB1 to PBn may temporarily store data received through the bit lines BL1 to BLn or may sense the voltages or currents of the bit lines BL1 to BLn during a read or a verify operation.

The column decoder 240 may transfer data between the input/output circuit 250 and the page buffer group 230 in response to a column address CADD. For example, the column decoder 240 may exchange data with the page buffers PB through data lines DL or may exchange data with the input/output circuit 250 through column lines CL.

The input/output circuit 250 may transfer a command CMD and an address ADD, received from a memory controller (e.g., 1200 of FIG. 1), to the control logic 300, or may exchange data DATA with the column decoder 240.

The sensing circuit 260 may generate a reference current in response to an enable bit VRY_BIT<#> and may output a pass signal PASS or a fail signal FAIL by comparing a sensing voltage VPB, received from the page buffer group 230, with a reference voltage, generated based on the reference current, during the read operation or the verify operation.

The control logic 300 may control the peripheral circuits 200 by outputting the operation signal OP_CMD, the row address RADD, the page buffer control signals PBSIGNALS, and the enable bit VRY_BIT<#> in response to the command CMD and the address ADD. Further, the control logic 300 may determine whether a verify operation has passed or failed in response to a pass or fail signal PASS or FAIL. In particular, during the verify operation or the read operation, the control logic 300 may control the source line voltage to be applied to the source lines and the pass voltage to be applied to the source select lines and drain select lines, and may control the peripheral circuits 200 so that the word lines included in a region in which a program operation has completed are sequentially discharged for respective groups. For example, the control logic 300 may control the peripheral circuits 200 so that, after the memory cells have been verified, the potentials of the selected word line, unselected word lines which are the remaining word lines other than the selected word line, and the first and second select lines are similar to each other. Further the control logic 300 may also control the peripheral circuits 200 so that, after the selected word line and the unselected word lines have been discharged, the first and second select lines are discharged. Further, in one particular example, the peripheral circuits 200 may sequentially discharge the word lines in an order that the program operation is performed, in a region that the program operation has completed.

Figure 3:
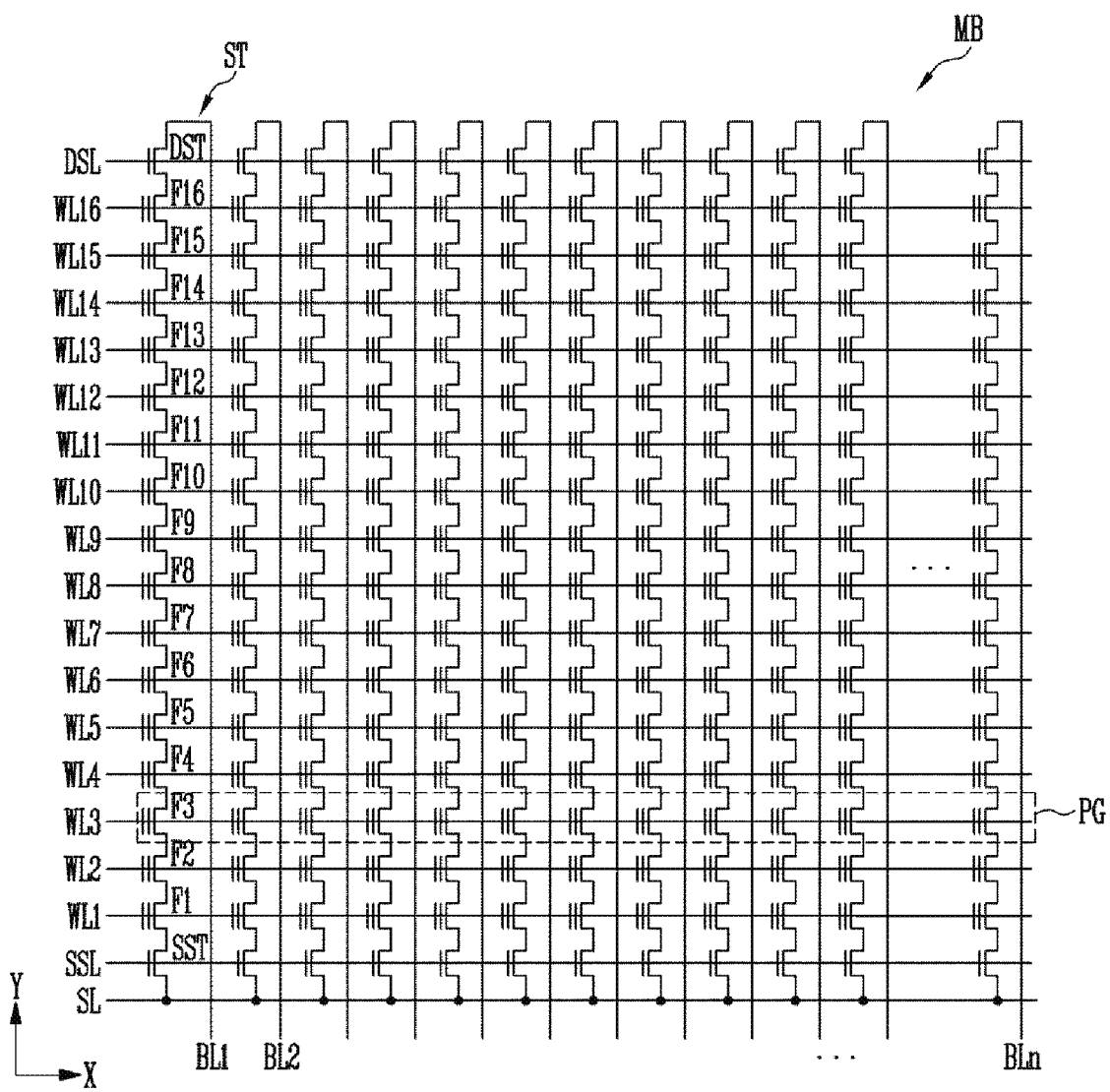
FIG. 3 is a diagram illustrating a memory block of FIG. 2.

FIG. 3 is a diagram illustrating the memory block of FIG. 2.

Referring to FIG. 3, the memory block may be configured such that a plurality of word lines, which are arranged in parallel, are coupled between a first select line and a second select line. Here, the first select line may be a source select line SSL and the second select line may be a drain select line DSL. In detail, the memory block may include a plurality of strings ST coupled between bit lines BL1 to BLn and a source line SL. The bit lines BL1 to BLn may be coupled to the strings ST, respectively, and the source line may be coupled in common to the strings ST. Because the strings ST may have the same configuration, a string ST coupled to the first bit line BL1 will be described in detail by way of example.

The string ST may include a source select transistor SST, a plurality of memory cells F1 to F16, and a drain select transistor DST, which are connected in series between the source line SL and the first bit line BL1. A single string ST may include one or more source select transistors SST and drain select transistors DST, and may include more memory cells than the memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells coupled to the same word line, among the memory cells included in different strings ST, may be referred to as a 'page PG'. Therefore, a number of pages PG that are identical to the number of word lines WL1 to WL16 may be included in the memory block. Thus, the memory block 100 may include a plurality of pages PG respectively coupled to word lines.

Figure 4:
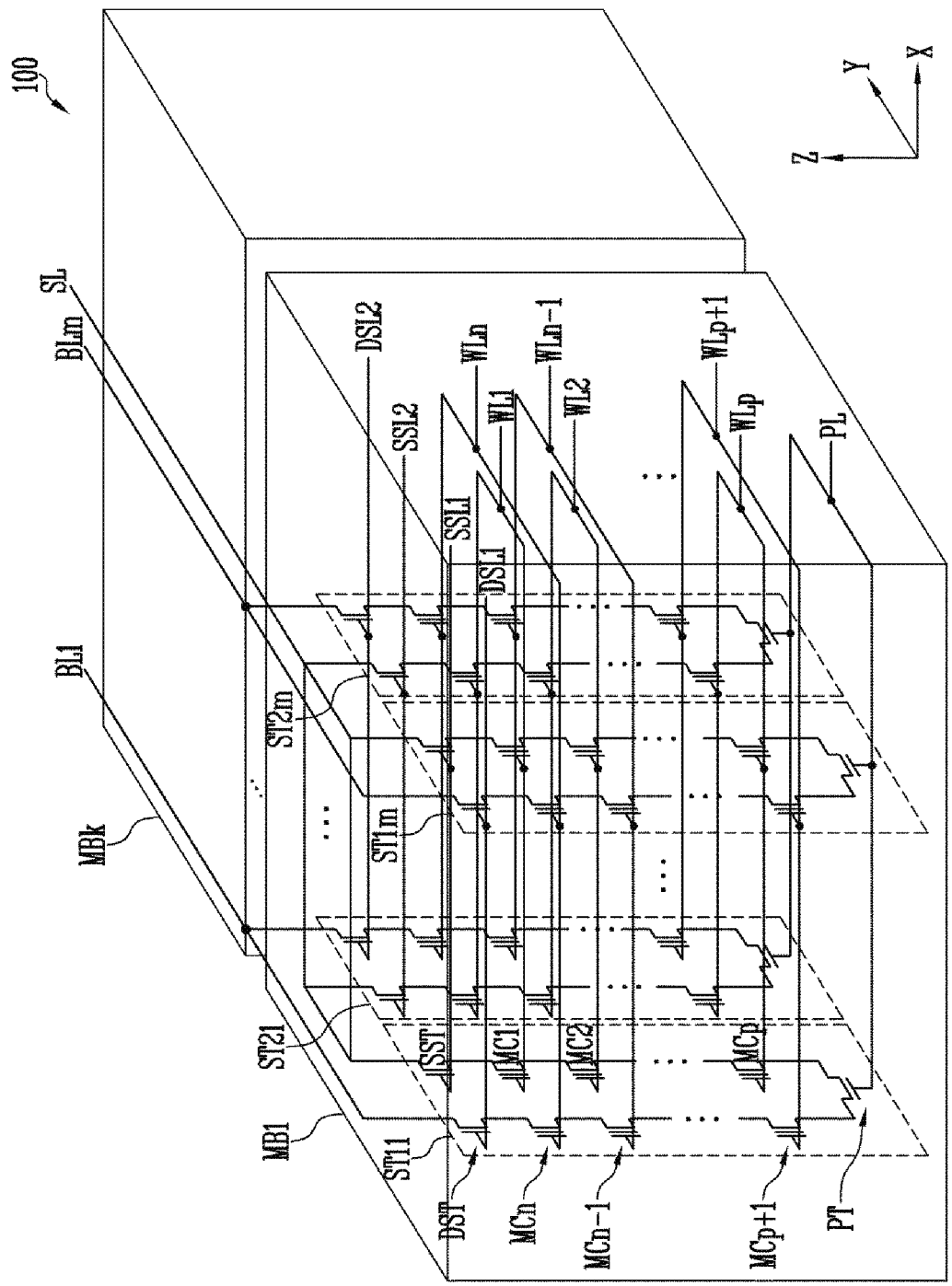
FIG. 4 is a diagram illustrating an embodiment of a memory block implemented in a 3D structure.

FIG. 4 is a diagram illustrating an embodiment of the memory block implemented in a 3D structure.

Referring to FIG. 4, a memory cell array 100 may include a plurality of memory blocks MB1 to MBk. The internal configuration of the first memory block MB1 is illustrated in FIG. 4 for a better understanding of the disclosure, and the internal configuration of the remaining memory blocks MB2 to MBk is omitted. The second to k-th memory blocks MB2 to MBk may have the same configuration as the first memory block MB1.

The first memory block MB1 may include a plurality of strings ST11 to ST1*m* and ST21 to ST2*m*. In an embodiment, each of the strings ST11 to ST1*m* and ST21 to ST2*m* may be formed in a 'U' shape. In the first memory block MB1, m strings may be arranged in a row direction (an X direction). In FIG. 4, two strings are illustrated as being arranged in a column direction (a Y direction). However, this illustration is made for the convenience of description, and three or more strings may be arranged in the column direction (the Y direction).

Each of the plurality of strings ST11 to ST1*m* and ST21 to ST2*m* may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. In an embodiment, each of the source and drain select transistors SST and DST and the memory cells MC1 to MCn may include a channel layer, a tunnel insulating layer, a charge trap layer, and a blocking insulating layer. For example, a pillar for providing the channel layer may be provided to each string. In an embodiment, a pillar for providing at least one of the channel layer, the tunnel insulating layer, the charge trap layer, and the blocking insulating layer may be provided to each string.

The source select transistor SST of each string may be coupled between a source line SL and memory cells MC1 to MCp.

In an embodiment, the source select transistors of strings arranged in the same row may be coupled to a source select line extended in a row direction, and source select transistors of strings arranged in different rows may be coupled to different source select lines. In FIG. 4, the source select transistors of the strings ST11 to ST1m in a first row may be coupled to a first source select line SSL1. The source select transistors of the strings ST21 to ST2m in a second row may be coupled to a second source select line SSL2.

In another embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (a Z direction) and may be connected in series between the source select transistor SST and the pipe transistor PT. The p+1-th to n-th memory cells MCp+1 to MCn may be sequentially arranged in the vertical direction (the Z direction) and may be connected in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled.

A gate of the pipe transistor PT of each string may be coupled to a pipeline PL.

The drain select transistor DST of each string may be coupled between the corresponding bit line and the memory cells MCp+1 to MCn. The strings arranged in a row direction may be coupled to drain select lines extended in the row direction. The drain select transistors of the strings ST11 to ST1m in a first row may be coupled to a first drain select line DSL1. The drain select transistors of the strings ST21 to ST2m in a second row may be coupled to a second drain select line DSL2.

The strings arranged in a column direction may be coupled to bit lines extended in the column direction. In FIG. 4, the strings ST11 and ST21 in a first column may be coupled to a first bit line BL1. The strings ST1m and ST2m in an m-th column may be coupled to an m-th bit line BLm.

Memory cells coupled to the same word line, among strings arranged in a row direction, constitute a single page. For example, memory cells coupled to the first word line WL1, among the strings ST11 to ST1m in the first row, may constitute a single page. Memory cells coupled to the first word line WL1, among the strings ST21 to ST2m in the second row, may constitute a single additional page. The strings arranged in the direction of a single row may be selected by selecting any one of the drain select lines DSL1 and DSL2. A single page may be selected from the selected strings by selecting any one of the word lines WL1 to WLn.

Figure 5:
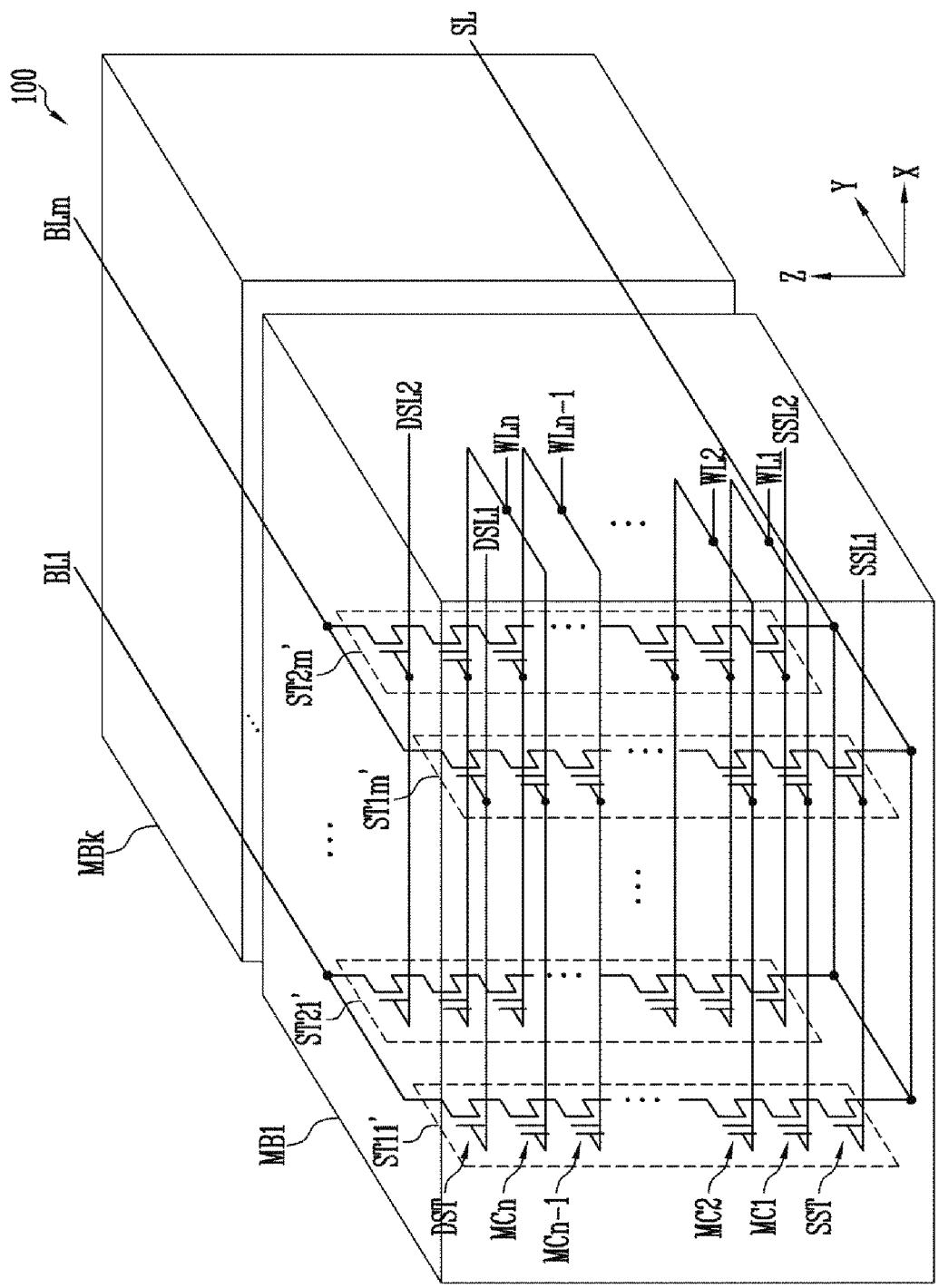
FIG. 5 is a diagram illustrating an embodiment of a memory block implemented in a 3D structure.

FIG. 5 is a diagram illustrating an embodiment of the memory block implemented in a 3D structure.

Referring to FIG. 5, a memory cell array 110 may include a plurality of memory blocks MB1 to MBk. The internal configuration of the first memory block MB1 is illustrated in FIG. 5 for a better understanding of the disclosure, and the internal configuration of the remaining memory blocks MB2 to MBk is omitted. The second to k-th memory blocks MB2 to MBk may have the same configuration as the first memory block MB1.

The first memory block MB1 may include a plurality of strings ST11' to ST1m' and ST21' to ST2m'. Each of the plurality of strings ST11' to ST1m' and ST21' to ST2m' may be extended along a vertical direction (a Z direction). In the first memory block MB1, m strings may be arranged in a row direction (an X direction). Although two strings are illustrated as being arranged in a column direction (a Y direction) in FIG. 5, this illustration is merely made for the convenience of description, and three or more strings may be arranged in the column direction (the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. The source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In other embodiments, the source select transistors of the strings ST11' to ST1m' and ST21' to ST2m' may be coupled in common to a single source select line.

The first to n-th memory cells MC1 to MCn in each string may be connected in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Accordingly, the reliability of data stored in the memory block MB1 may be improved.

The drain select transistor DST of each string may be coupled between the corresponding bit line and the memory cells MC1 to MCn. The drain select transistors DST of strings arranged in a row direction may be coupled to drain select lines extended in the row direction. The drain select transistors DST of the strings ST11' to ST1m' in a first row may be coupled to a first drain select line DSL1. The drain select transistors DST of the strings ST21' to ST2m' in a second row may be coupled to a second drain select line DSL2.

That is, the memory block MB1 of FIG. 5 may have an equivalent circuit similar to that of the memory block MB1 of FIG. 4 except that a pipe transistor PT is excluded from each string.

Figure 6:
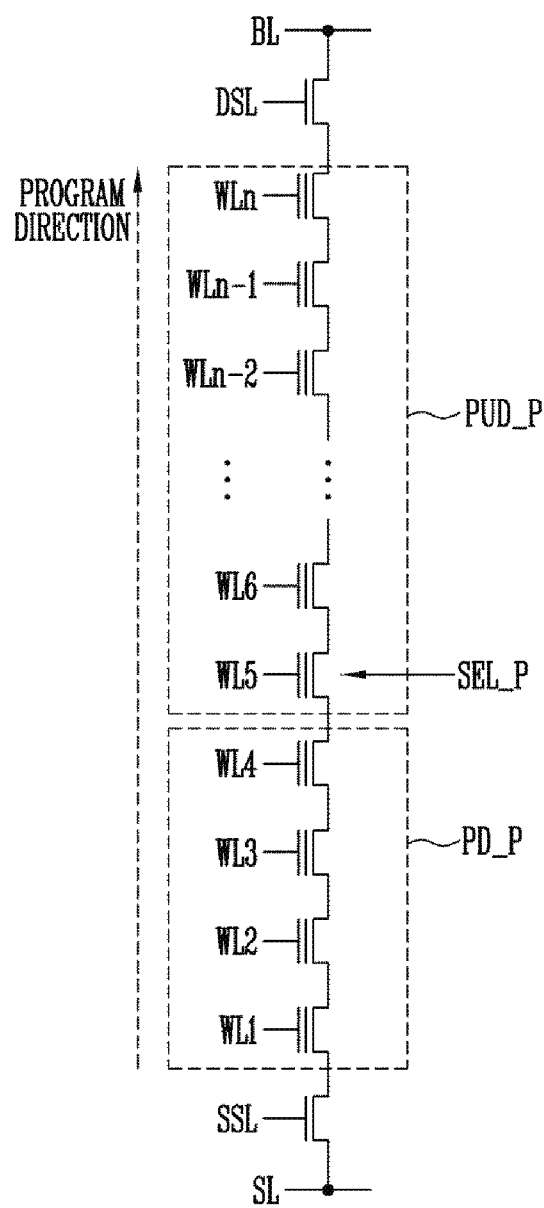
FIGS. 6 and 7 are diagrams illustrating a program operation.
Figure 7:
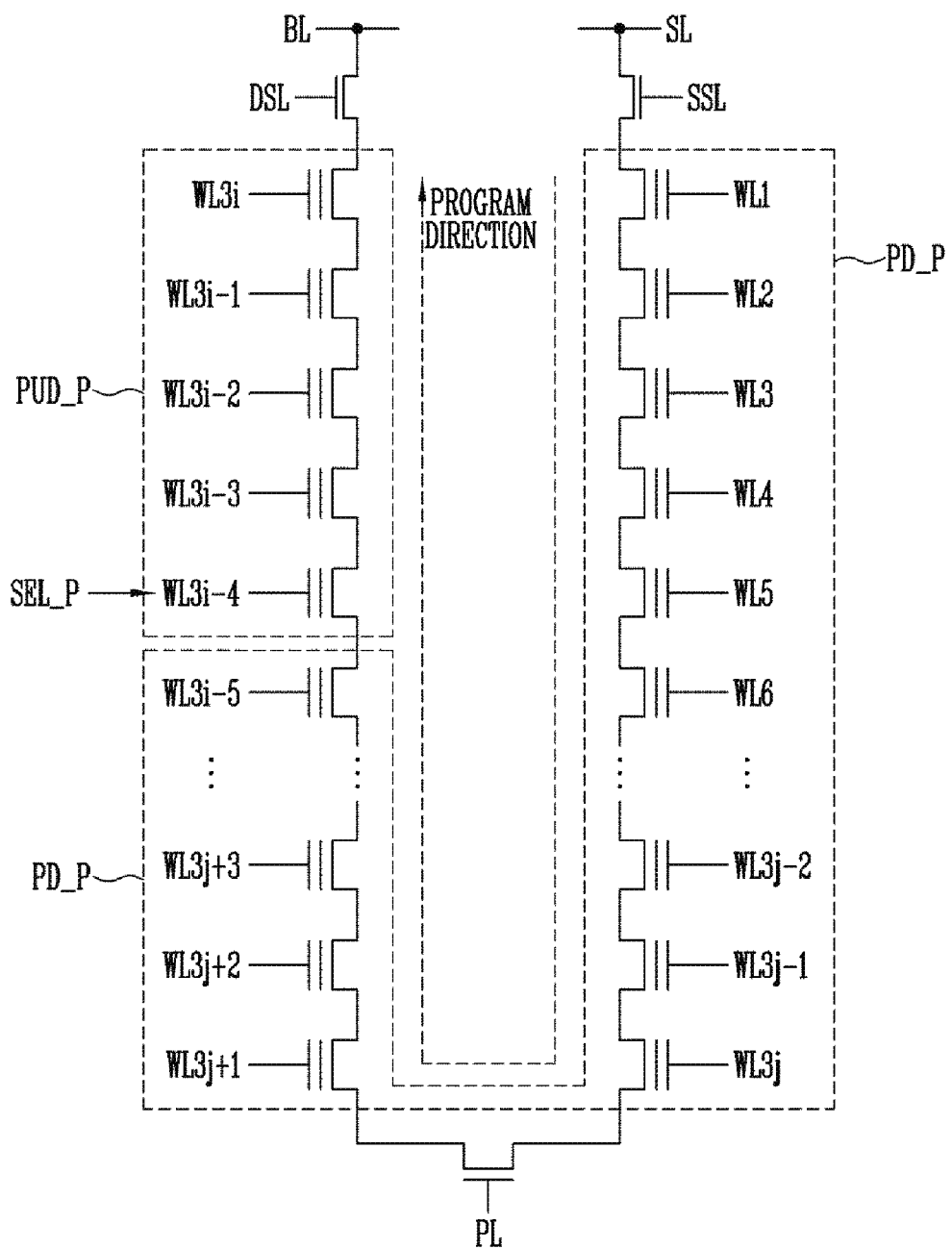

FIGS. 6 and 7 are diagrams illustrating a program operation.

Referring to FIG. 6, the program operation may be performed on a page basis. A program operation of an I-shaped string coupled between a source line SL and a bit line BL will be described by way of example.

The program operation may be performed using an incremental step pulse program (ISPP) method of increasing a program voltage by a step voltage as the number of program loops increases. The program loops may include the operation of applying a program voltage to a selected word line and increasing the threshold voltages of selected memory cells, and a verify operation of determining whether the threshold voltages of the memory cells have increased to target voltages. The program operation may be performed either in a direction from a first page coupled to a first word line WL1 to an n-th page coupled to an n-th word line WLn, or in the opposite direction. When the program voltage is applied to the selected word line, a pass voltage may be applied to the remaining unselected word lines. During the verify operation, when a verify voltage is applied to the selected word line, a pass voltage may be applied to the remaining unselected word lines. The pass voltages that are applied to the unselected word lines in the program voltage apply operation and in the verify operation may be adjusted to be equal to or different from each other. When the verify operation is terminated, all word lines may be discharged for a subsequent operation. At this time, the operation of preventing the potential of the selected word line from decreasing to a negative voltage may be performed. For example, the voltage to be applied to the selected word line may be increased so that the potential of the selected word line and the potentials of the unselected word lines are equal to each other. For example, a turn-on voltage that allows all memory cells coupled to the selected word line to be turned on may be applied to the selected word line. For example, the pass voltage that allows all memory cells to be turned on may be applied to the unselected word lines, and the turn-on voltage that allows memory cells to be turned on may be applied to the selected word line. Here, the turn-on voltage may be a voltage equal to the pass voltage. Then, the word lines, the voltages of which may become equal to each other, may be discharged.

When a selected page SEL_P in the selected memory block is a first page, there is no page on which the program operation has completed, and thus all pages in the selected memory block may be program-uncompleted pages (or program-not done pages) PUD_P. After the program operation of the first page has completed, the selected memory block may include program-completed pages (or program-done pages) PD_P and program-uncompleted pages PUD_P. Because the selected page SEL_P is also a page on which the program operation is currently being performed, the selected page SEL_P may be included in the program-uncompleted pages PUD_P. For example, assuming that a fifth page coupled to a fifth word line WL5 is the selected page SEL_P, pages coupled to the first to fourth word lines WL1 to WL4 are included in the program-completed pages PD_P and pages coupled to the remaining fifth to n-th word lines WL5 to WLn may be included in the program-uncompleted pages PUD_P.

Referring to FIG. 7, a program operation of a U-shaped string coupled between the source line SL and the bit line BL will be described by way of example.

The program operation may be performed using the same method as described in FIG. 6. However, in this example, the string is configured in a U-shape. Accordingly, when the program operation is performed in a direction from the first page coupled to the first word line WL1, the program operation may be sequentially performed from the first page to a 3j-th page, and may then be sequentially performed from a 3j+1-th page to a 3i-th page. When the program operation is performed in the opposite direction, the program operation may be sequentially performed from the 3i-th page to the 3j+1-th page, and may then be sequentially performed from the 3j-th page to the first page. For example, when the program operation is sequentially performed in a direction from the page coupled to the first word line WL1, and a page coupled to a 3i–4-th word line WL3i-4 is the selected page, pages coupled to the first to 3i–5-th word lines WL3i-5 may be included in the program-completed pages PD_P, and pages coupled to the 3i–4-th to 3i-th word lines WL3i-4 to WL3i may be included in the program-uncompleted pages PUD_P.

Figure 8:
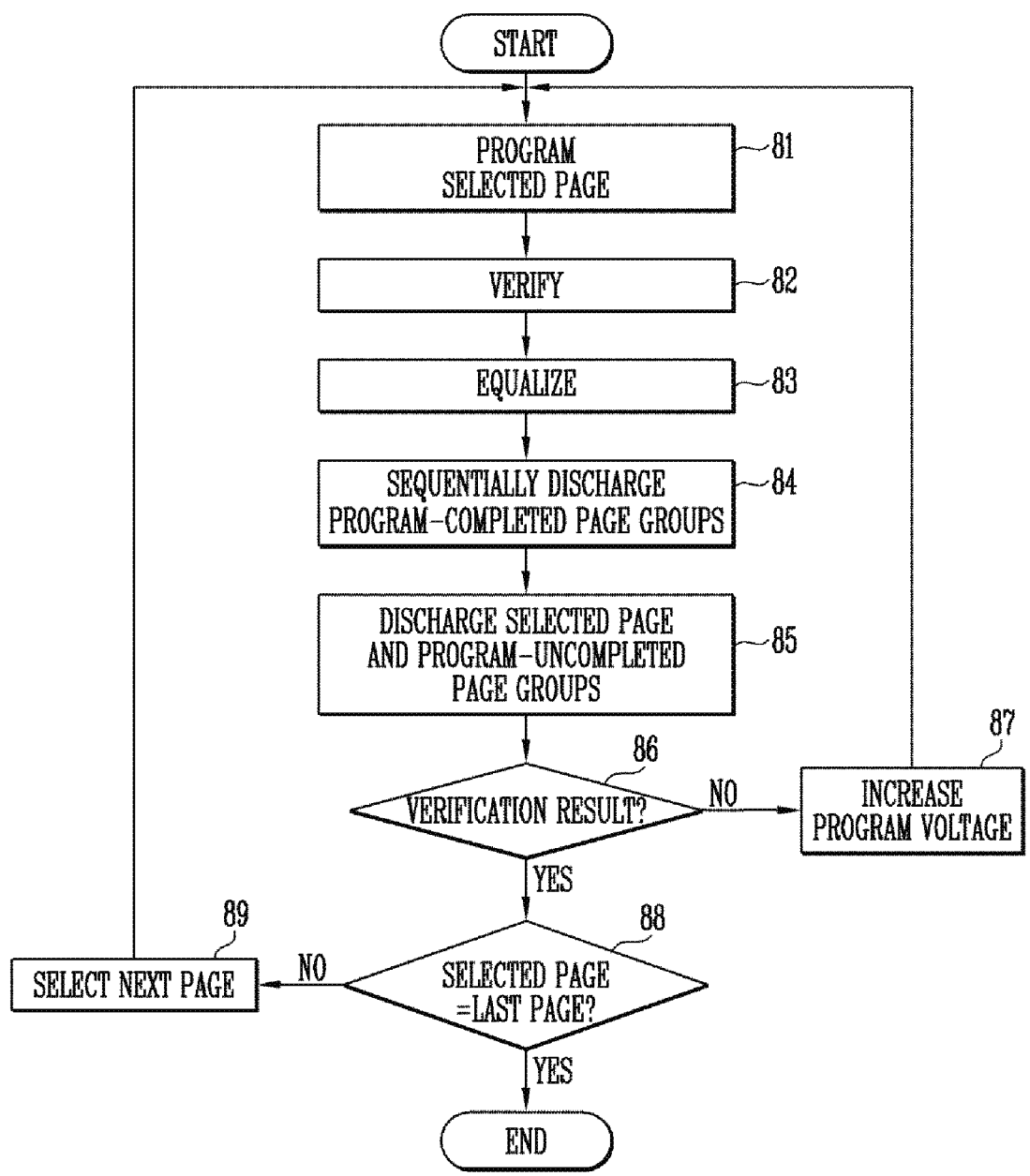
FIG. 8 is a flowchart for explaining a program operation according to an embodiment of the present disclosure.

FIG. 8 is a flowchart for explaining a program operation according to an embodiment of the present disclosure.

Referring to FIG. 8, when a program operation starts, the program operation may be performed on selected memory cells included in a selected page at step 81. For example, a program voltage may be applied to a selected word line coupled to the selected page, and then the selected memory cells may be programmed. After the program voltage has been applied to the selected word line for a predetermined period of time, a verify operation may be performed on the selected page at step 82. For example, in the verify operation, a verify voltage may be applied to the selected word line, and it may be determined whether the threshold voltages of the selected memory cells have increased to target voltages. The control logic 300 of FIG. 2 may control the peripheral circuits 200 such that after the verify operation has been performed for a predetermined period of time, a turn-on voltage apply operation may be performed at step 83. The turn-on voltage apply operation may be performed to prevent the potential of the selected word line from decreasing to a negative voltage. For example, a turn-on voltage may be applied to the selected word line during the turn-on voltage apply operation so that all memory cells coupled to the selected word line may be turned on. For example, the turn-on voltage may be set to a voltage equal to the pass voltage that is applied to the unselected word lines by the peripheral circuits 200 of FIG. 2 during the turn-on voltage apply operation. In one embodiment, the peripheral circuits 200 may apply the turn-on voltage to the selected word line when the pass voltage is applied to the unselected word lines.

If the turn-on voltage apply operation has been performed for a predetermined period of time, all word lines coupled to the selected memory block are discharged to perform a subsequent operation at steps 84 and 85. In the embodiment of the present disclosure, word lines included in groups of program-completed pages and word lines included in groups of program-uncompleted pages may be discharged at different times (at predetermined time intervals). For example, the word lines included in a region including the program-completed page groups (page groups may also be referred to as word line groups) may be sequentially discharged at step 84 by the control logic 300 controlled by the peripheral circuits 200 as shown in FIG. 2. Subsequently, the word lines included in a region including the program-uncompleted page groups may be discharged at step 85 by the control logic 300 controlled by the peripheral circuits 200 as shown in FIG. 2. Further, steps 84 and 85 may be performed while the turn-on voltage apply operation at step 83 is performed.

At step 84, the program-completed page groups may be set such that each of the pages on which the program operation has completed is set to a single group, and a plurality of pages on which the program has completed may be set to a next single group. The word lines included in the program-completed page groups may be sequentially discharged in the order of the program operation. Here, the word lines included in the same group may be simultaneously discharged, and then the word lines included in a next program-completed page group may be simultaneously discharged.

At step 85, the program-uncompleted page groups may be set such that pages including the selected page, on which the program operation has not yet completed, are set to a single group.

Therefore, as the number of program loops increases, pages included in program-completed page groups and program-uncompleted page groups may change.

The verify operation is performed on the selected page at step 86. When the selected page fails in the verify operation, the program voltage increases for a next program loop at step 87. The program loop for the selected page (steps 81 to 87) may be repeated until the selected page has passed the verify operation.

At step 86, if the selected page has passed the verify operation, it is determined whether the selected page is the last page at step 88. For example, it is determined whether a page selected from among the pages included in the selected memory block is the last page. If it is determined that the selected page is not the last page (in case of "No"), a next page is selected at step 89, and steps 81 to 88 may be repeated. At step 88, if it is determined that the selected page is the last page (in case of "Yes"), the program operation of the selected memory block may be terminated.

The above-described program operation will be described in detail below.

Figure 9:
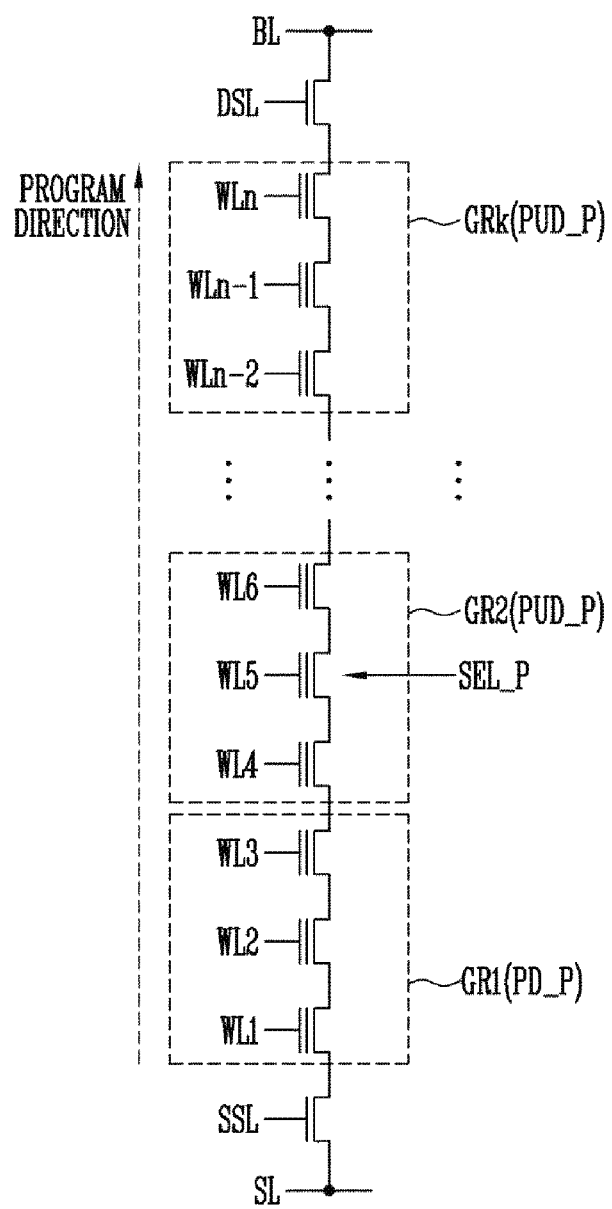
FIGS. 9 and 10 are diagrams for explaining a program operation according to an embodiment of the present disclosure.
Figure 10:
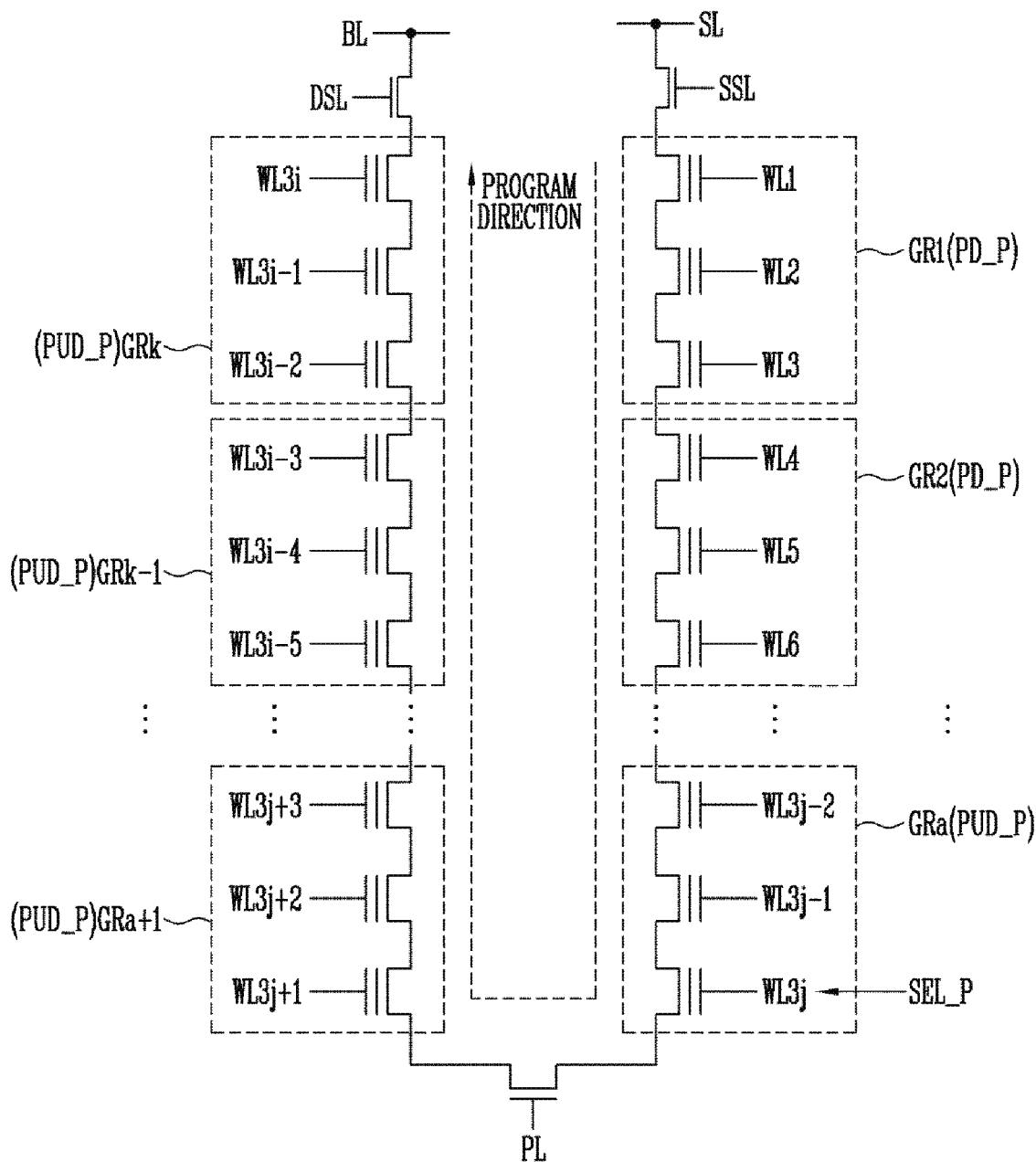

FIGS. 9 and 10 are diagrams for explaining a program operation according to an embodiment of the present disclosure.

Referring to FIG. 9, a program operation of an I-shaped string will be described below by way of example.

It is assumed that the program operation is performed in a direction from a source select line SSL to a drain select line DSL, and first to n-th pages are set to a plurality of page groups, each including three pages. For example, first to third pages coupled to first to third word lines WL1 to WL3 may be set to a first page group GR1, and fourth to sixth pages coupled to fourth to sixth word lines WL4 to WL6 may be set to a second page group GR2. In this way, the first to n-th word lines WL1 to WLn may be divided into first to k-th page groups GR1 to GRk. Although an embodiment in which three pages are included in one page group is illustrated in FIG. 9, this is only an embodiment for a better understanding of description, and each page group may be set to include one or more pages.

For example, when the fifth page coupled to the fifth word line WL5 is the selected page, only the first page group GR1 may be a program-completed page group PD_P, and page groups ranging from the second page group GR2 including the selected page to the last k-th page group GRk may be program-uncompleted page groups PUD_P. In this case, when the turn-on voltage apply operation (step 83 of FIG. 8) is terminated, the first to third word lines WL1 to WL3 coupled to the first page group GR1 which is the program-completed page group PD_P may be simultaneously discharged (step 84 of FIG. 8) by the peripheral circuits 200 of FIG. 2. Subsequently, the fourth to n-th word lines WL4 to WLn coupled to the remaining second to k-th page groups GR2 to GRk may be simultaneously discharged. The fifth word line WL5 coupled to the selected page may be discharged at the same time that the operation of discharging the program-uncompleted page groups PUD_P is performed by the peripheral circuits 200.

Referring to FIG. 10, a program operation of a U-shaped string will be described below by way of example.

It is assumed that the program operation is performed in a direction from the source select line SSL to the drain select line DSL, and first to 3i-th pages are set to a plurality of page groups, each including three pages. In FIG. 10, the number of pages included in each page group may be set differently depending on the memory device. For example, the first to third pages coupled to first to third word lines WL1 to WL3 may be set to a first page group GR1, and fourth to sixth pages coupled to fourth to sixth word lines WL4 to WL6 may be set to a second page group GR2. In this way, the first to 3i-th word lines WL1 to WL3$i$ may be divided into first to k-th page groups GR1 to GRk.

For example, when a 3j-th page coupled to a 3j-th word line WL3$j$ is the selected page, first to a-1-th page groups GR1 to GRa−1 may be program-completed page groups PD_P, and page groups ranging from an a-th page group GRa including the selected page to the last k-th page group GRk may be program-uncompleted page groups PUD_P. In this case, when the turn-on voltage apply operation (step 83 of FIG. 8) is terminated, the first to 3j−3-th word lines WL1 to WL3$j$−3 coupled to the first to a-1-th page groups GR1 to GRa−1 which are program-completed page groups PD_P may be sequentially discharged (step 84 of FIG. 8). For example, after the word lines included in the first page group GR1 have been simultaneously discharged, the word lines included in the second page group GR2 may be simultaneously discharged. In this way, the word lines included in the a-1-th page group GRa−1 may be sequentially discharged. When the operation of discharging the program-completed page groups PD_P has terminated, word lines included in the remaining program-uncompleted page groups PUD_P may be simultaneously discharged. The 3j-th word line coupled to the selected page may be discharged at the same time that the operation of discharging the program-uncompleted page groups PUD_P is performed.

FIGS. 11 to 14 are timing diagrams for explaining a program operation according to an embodiment of the present disclosure, and illustrate different embodiments.

Figure 11:
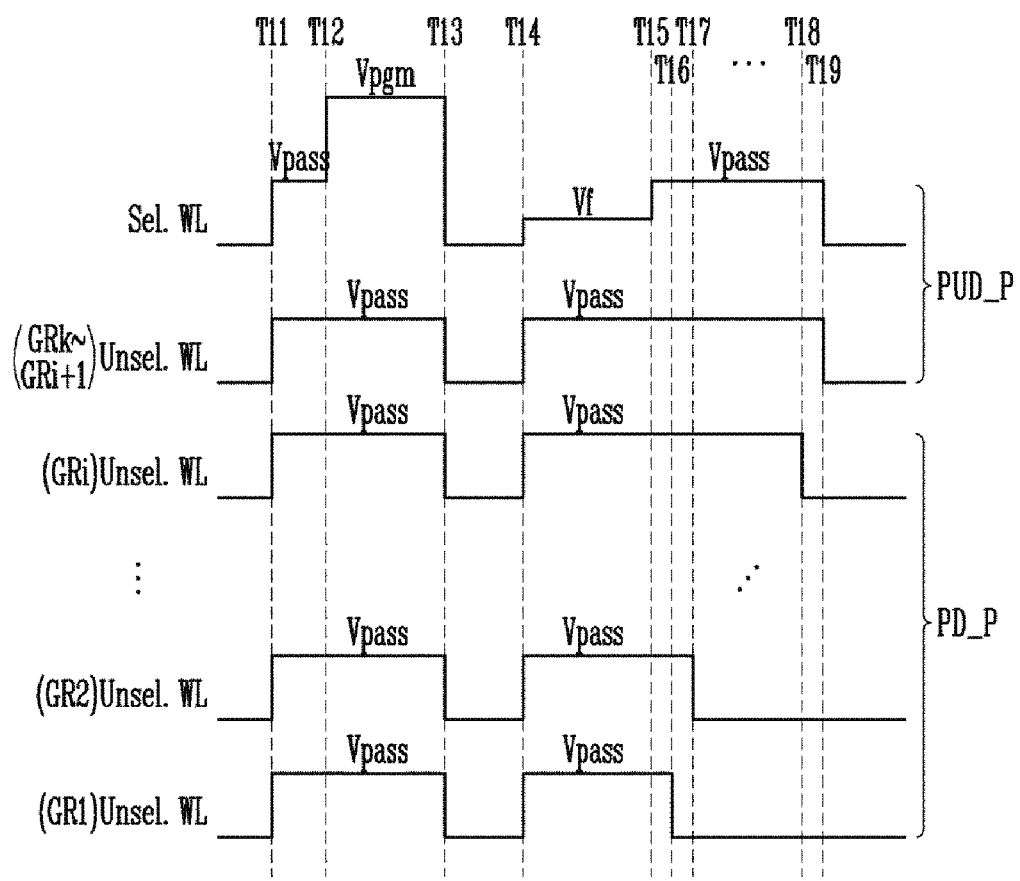
FIGS. 11 to 14 are timing diagrams for explaining a program operation according to an embodiment of the present disclosure.

Referring to FIG. 11, it is assumed that pages in a selected memory block are set to first to k-th page groups GR1 to GRk. The program operation may be performed using an incremental step pulse program (ISPP) method of increasing a program voltage by a step voltage whenever a program loop is performed. A period from time T11 to time T13 may be a program period, a period from time T13 to time T14 may be a discharge period, a period from time T14 to time T15 may be a verify period, and a period from time T15 to time T19 may be a turn-on voltage apply period.

When the program period from T11 to T13 starts, a pass voltage Vpass is applied to a selected word line Sel.WL and to unselected word lines Unsel.WL, and then the channel voltages of unselected strings are increased (T11 to T12). A program voltage Vpgm is applied to the selected word line Sel.WL, and then a program operation may be performed on selected memory cells. Although not illustrated in the drawing, a program permission voltage or a program prohibition voltage may be applied to bit lines depending on externally input program data before time T11. The program permission voltage may be 0 V, and the program prohibition voltage may be a positive voltage. After the voltages of the bit lines are transferred to the channels, select transistors in the unselected strings are turned off, thus causing the channels to float. The floating channels may be boosted due to coupling to the pass voltage Vpass, so that the potentials of the channels may be increased. This operation is referred to as 'channel boosting', which is a method generally used in the program operation, and thus a detailed description thereof will be omitted. When channel boosting occurs during the period from T11 to T12, the program voltage Vpgm may be applied to the selected word line Sel.WL at time T12.

When the program voltage Vpgm is applied to the selected word line Sel.WL for a predetermined period of time (T12 to T13), the discharge period from T13 to T14 may be executed in a subsequent operation.

During the discharge period from T13 to T14, all word lines Sel.WL and Unsel.WL, as well as bit lines, and all source select lines Sel.SSL and Unsel.SSL may be simultaneously discharged.

If the discharge period has terminated (at time T14), the verify period from T14 to T15 may be executed. When the verify period from T14 to T15 starts (at time T14), the pass voltage Vpass may be applied to the unselected word lines Unsel.WL, and a verify voltage Vf may be applied to the selected word line Sel.WL.

If the verify period from T14 to T15 has terminated (at time T15), the turn-on voltage apply period from T15 to T19 may be executed. The turn-on voltage apply period from T15 to T19 may be performed to prevent the potential of the selected word line Sel.WL from decreasing to a negative voltage in a discharge operation to be subsequently performed. For example, during the turn-on voltage apply period from T15 to T19 of the turn-on voltage apply operation, the voltage to be applied to the selected word line Sel.WL may be increased so that the potentials of the selected word line Sel.WL and the unselected word lines Unsel.WL are equal to each other. For example, the pass voltage Vpass may be applied to the selected word line Sel.WL so that all memory cells coupled to the selected word line Sel.WL are turned on.

While the turn-on voltage apply period from T15 to T19 is executed, some of the unselected word lines Unsel.WL may be discharged (T16 to T19). According to an embodiment, among the unselected word lines Unsel.WL, word lines included in the program-completed page groups may be discharged first (T16 to T18). For example, it is assumed that the word lines are divided into first to k-th page groups GR1 to GRk (where k is a positive integer). Here, when the first to i-th page groups GR1 to GRi (where i is a positive integer less than k) are program-completed page groups PD_P, and the remaining i+1-th to k-th page groups GRi+1 to GRk are program-uncompleted page groups PUD_P, word lines respectively coupled to the first to i-th page groups GR1 to GRi may be sequentially discharged (T16 to T18). For example, at time T16, unselected word lines Unsel.WL coupled to the first page group GR1 may be simultaneously discharged. If a predetermined time has passed, and time T17 is reached, unselected word lines Unsel.WL coupled to the second page group GR2 may be simultaneously discharged. In this way, the operations of discharging word lines ranging to unselected word lines Unsel.WL coupled to the i-th page group GRi may be sequentially performed. The time differences (intervals) between discharging different page groups may be designated to be the same or may be gradually reduced. If the operation of discharging the last page group GRi, among the program-completed page groups PD_P, is terminated (at time T18), the operation of discharging the unselected word lines Unsel.WL, which are coupled to i+1-th to k-th page groups GRi+1 to GRk included in the remaining program-uncompleted page groups PUD_P and the operation of discharging the selected word line Sel.WL may be simultaneously performed (at time T19).

In this way, the reason for discharging the unselected word lines Unsel.WL, included in the program-completed page groups PD_P, for respective groups in the order of programming is given as follows.

Because the threshold voltages of the unselected memory cells on which the program operation has been performed have already increased, over-programming may be prevented from occurring due to high channel voltages when the operation of programming the selected memory cells is performed. During the turn-on voltage apply period from T15 to T19, the voltages of channels may be decreased due to coupling when the word lines are discharged. At this time, because the threshold voltages of unselected memory cells on which the program operation is not performed are low, these unselected memory cells may not be greatly influenced. However, because the threshold voltages of unselected memory cells on which the program operation has been performed are high, a program disturbance occurs when channel voltages are decreased, and thus the threshold voltages may vary.

Therefore, as in the case of the embodiment in FIG. 11, word lines coupled to the memory cells on which the program operation has completed are discharged first, thus solving a program disturbance attributable to variation in channel voltages.

Figure 12:
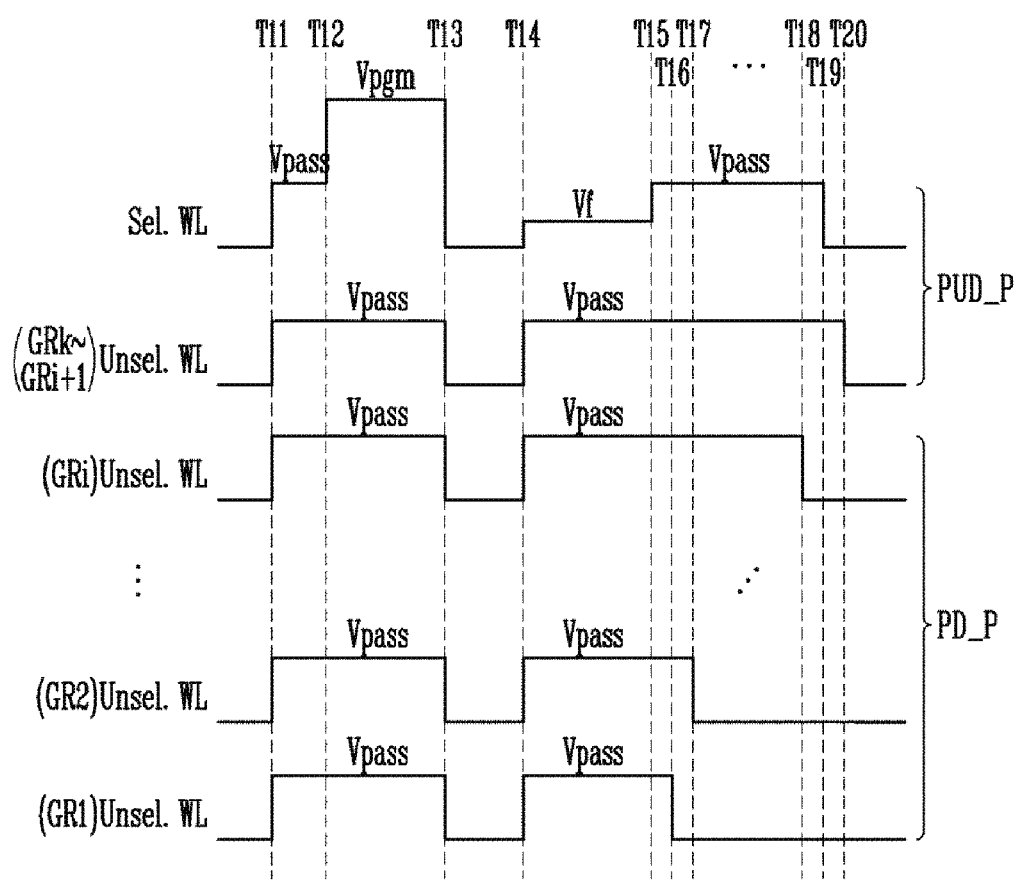

Referring to FIG. 12, a process corresponding to a period from time T11 to time T18 may be performed in the same manner as that of FIG. 11. At time T19 of FIG. 12, only a selected word line Sel.WL is discharged. At time T20 after the selected word line Sel.WL has been discharged, the operation of discharging unselected word lines Unsel.WL coupled to i+1-th to k-th page groups GRi+1 to GRk included in remaining program-uncompleted page groups PUD_P may be performed (T20).

Figure 13:
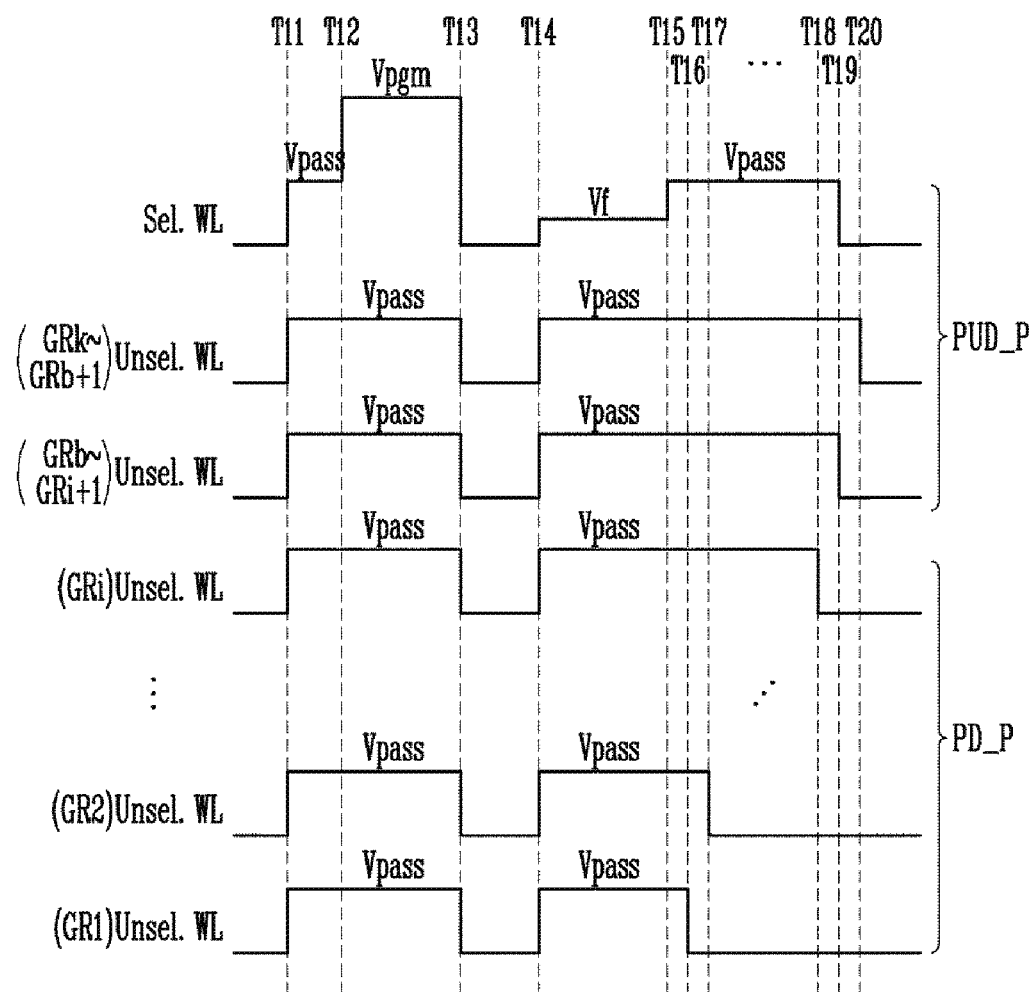

Referring to FIG. 13, a process corresponding to a period from time T11 to time T18 may be performed in the same manner as that of FIG. 11. At time T19 of FIG. 13, a selected word line Sel.WL and unselected word lines Unsel.WL coupled to some page groups included in program-uncompleted page groups PUD_P, for example, i+1-th to b-th page groups GRi+1 to GRb, may be simultaneously discharged. At time T20 after time T19, the operation of discharging unselected word lines Unsel.WL coupled to the remaining b+1-th to k-th page groups GRb+1 to GRk may be performed (T20).

Alternatively, at time T19, the operations of discharging the selected word line Sel.WL and discharging unselected word lines Unsel.WL coupled to b+1-th to k-th page groups GRb+1 to GRk may be simultaneously performed. Thereafter, at time T20, unselected word lines Unsel.WL coupled to the remaining i+1-th to b-th page groups GRi+1 to GRb may be discharged.

Figure 14:
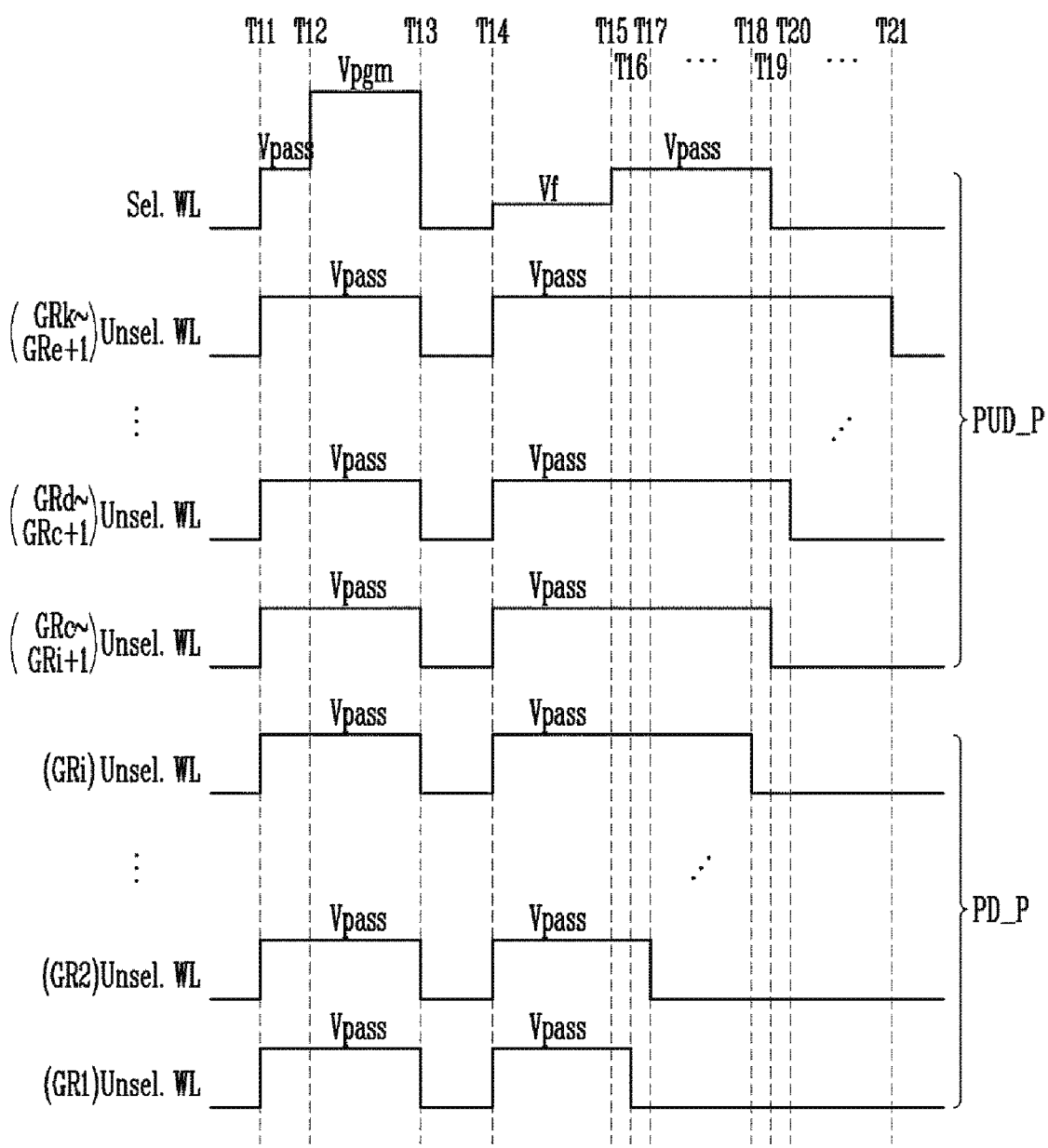

Referring to FIG. 14, a process corresponding to a period from time T11 to time T18 may be performed in the same manner as that of FIG. 11. At time T19 of FIG. 14, a selected word line Sel.WL and unselected word lines Unsel.WL coupled to some page groups included in program-uncompleted page groups PUD_P may be simultaneously discharged. During a period from time T20 to time T21, unselected word lines coupled to the remaining page groups included in the program-uncompleted page groups PUD_P may be sequentially discharged for respective groups. For example, the selected word line Sel.WL and unselected word lines Unsel.WL coupled to i+1-th to c-th page groups GRi+1 to GRc may be simultaneously discharged (at time T19). Then, the unselected word lines Unsel.WL coupled to c+1-th to d-th page groups GRc+1 to GRd may be discharged (at time T20). In this way, word lines ranging to the unselected word lines coupled to the remaining page groups GRe+1 to GRk included in the program-uncompleted page groups PUD_P may be sequentially discharged (T20 to T21).

Alternatively, at time T19, only the selected word line Sel.WL may be discharged, and from time T20, the unselected word lines Unsel.WL coupled to the program-uncompleted page groups PUD_P may be sequentially discharged.

Figure 15:
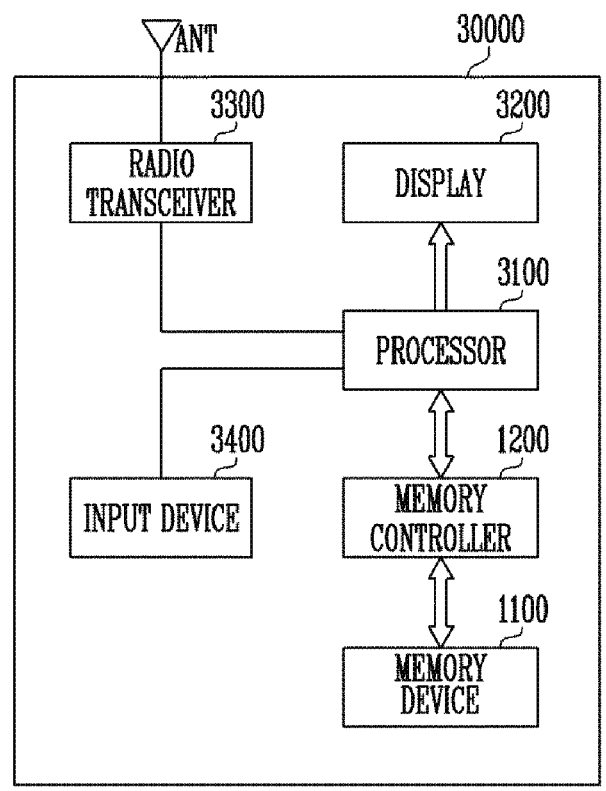
FIG. 15 is a diagram illustrating an embodiment of a memory system including the memory device of FIG. 2.

FIG. 15 is a diagram illustrating an embodiment of a memory system including the memory device illustrated in FIG. 2.

Referring to FIG. 15, a memory system 30000 may be embodied in a cellular phone, a smartphone, a tablet PC, a personal digital assistant (PDA), or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under control of a processor 3100.

Data programmed in the memory device 1100 may be output through a display 3200 under control of the memory controller 1200.

A radio transceiver 3300 may send and receive radio signals through an antenna ANT. For example, the radio transceiver 3300 may change a radio signal received through the antenna ANT into a signal which may be processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad, or a keyboard. The processor 3100 may control the operation of the display 3200 such that data output from the memory controller 1200, data output from the radio transceiver 3300, or data output from the input device 3400 is output through the display 3200.

In an embodiment, the memory controller 1200 capable of controlling the operation of the memory device 1100 may be implemented as a part of the processor 3100 or a chip provided separately from the processor 3100.

Figure 16:
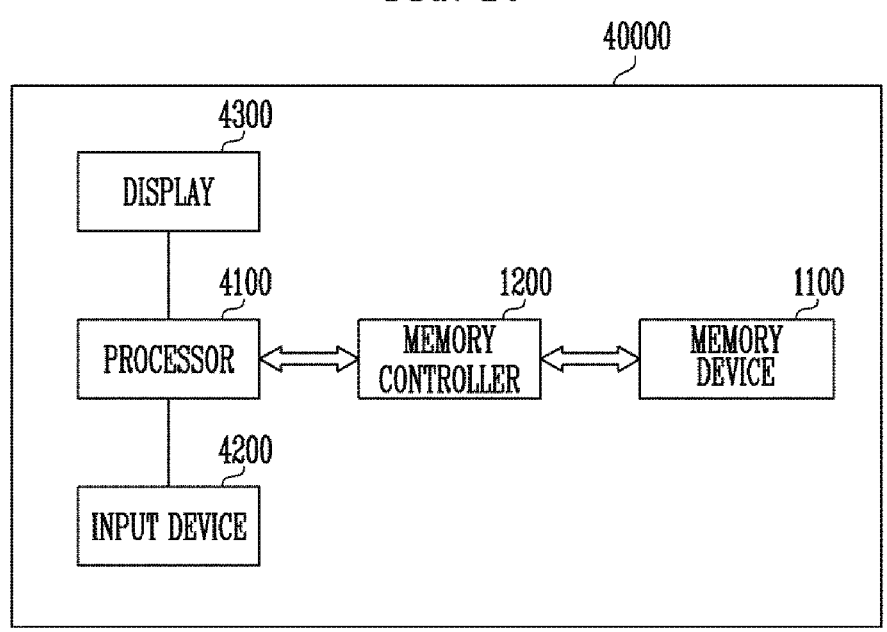
FIG. 16 is a diagram illustrating an embodiment of a memory system including the memory device of FIG. 2.

FIG. 16 is a diagram illustrating an embodiment of a memory system including the memory device illustrated in FIG. 2.

Referring to FIG. 16, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data input from an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 17:
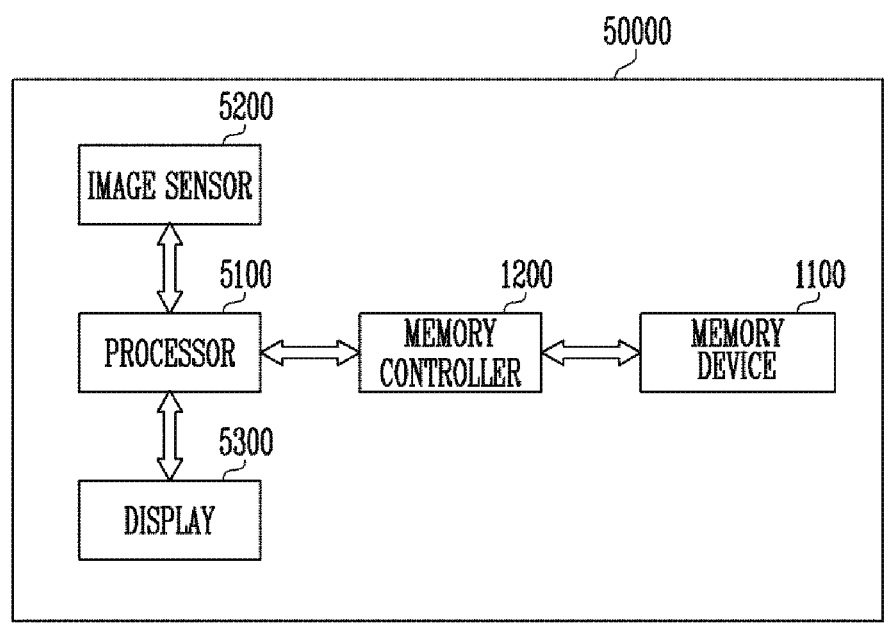
FIG. 17 is a diagram illustrating an embodiment of a memory system including the memory device of FIG. 2.

FIG. 17 is a diagram illustrating an embodiment of a memory system including the memory device illustrated in FIG. 2.

Referring to FIG. 17, a memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the memory controller 1200. Data stored in the memory device 1100 may be output through the display 5300 under control of the processor 5100 or the memory controller 1200.

In an embodiment, the memory controller 1200 capable of controlling the operation of the memory device 1100 may be implemented as a part of the processor 5100, or a chip provided separately from the processor 5100.

Figure 18:
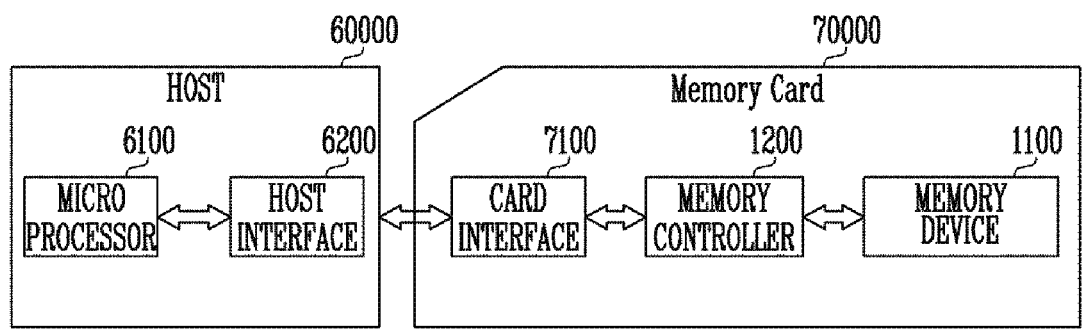
FIG. 18 is a diagram illustrating an embodiment of a memory system including the memory device of FIG. 2.

FIG. 18 is a diagram illustrating an embodiment of a memory system including the memory device illustrated in FIG. 2.

Referring to FIG. 18, a memory system 70000 may be embodied in a memory card or a smart card. The memory system 70000 may include the memory device 1100, a memory controller 1200, and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under control of a microprocessor 6100.

The present disclosure may improve the reliability of a program operation of a memory device.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device, comprising:
   a memory block including a plurality of word lines;
   peripheral circuits configured to perform a verify operation and a discharge operation on memory cells coupled to a selected word line which is selected from among the word lines; and
   a control logic configured to control the peripheral circuits such that, during the discharge operation, word lines coupled to memory cells having threshold voltages lower than target threshold voltages and word lines coupled to memory cells having the target threshold voltages are discharged at different times.

2. The memory device according to claim 1, wherein the control logic is configured to control the peripheral circuits such that the selected word line is discharged when the word lines coupled to the memory cells having the threshold voltages lower than the target threshold voltages are discharged.

3. The memory device according to claim 1, wherein the word lines are divided into a plurality of word line groups, each including at least two word lines.

4. The memory device according to claim 3, wherein the word line groups are discharged at different times.

5. The memory device according to claim 3, wherein the control logic is configured to control the peripheral circuits such that the word line groups coupled to the memory cells having the target threshold voltages are sequentially discharged.

6. The memory device according to claim 1, wherein the peripheral circuits perform a program operation before performing the verify operation.

7. The memory device according to claim 5, wherein the peripheral circuits are configured to sequentially discharge the word line groups coupled to the memory cells having the target threshold voltages in an order in which the program operation is performed.

8. The memory device according to claim 3, wherein the peripheral circuits are configured to simultaneously discharge the word line groups coupled to the memory cells having the threshold voltages lower than the target threshold voltages.

9. The memory device according to claim 1, wherein after a word line included in a word line group including the selected word line and coupled to the memory cells having the target threshold voltages is discharged, the selected word line and a word line included in the word line group including the selected word line and coupled to the memory cells having the threshold voltages lower than the target threshold voltages are simultaneously discharged.

10. A memory device, comprising:
    a memory block including a plurality of memory cells coupled to word lines, respectively, wherein the word lines are disposed between a first select line and a second select line;
    peripheral circuits configured to sequentially perform a verify operation on selected memory cells among the memory cells in a direction from the first select line to the second select line, and perform a discharge operation of the word lines; and
    a control logic configured to control the peripheral circuits such that, during the discharge operation performed, unselected word lines disposed between a selected word line coupled to the selected memory cells and the first select line are discharged first, and unselected word lines disposed between the selected word line and the second select line are then discharged.

11. The memory device according to claim 10, wherein the control logic is configured to control the peripheral circuits such that the selected word line is discharged when the unselected word lines disposed between the selected word line and the second select line are discharged.

12. The memory device according to claim 10, wherein the word lines are divided into a plurality of word line groups, each including at least one word line.

13. The memory device according to claim 10, wherein the peripheral circuits perform a program operation before performing the verify operation.

14. A method of operating a memory device, comprising:
    performing a verify operation on selected memory cells among memory cells disposed between a first select line and a second select line by applying a verify voltage to a selected word line and by applying a pass voltage to unselected word lines, wherein the verify operation is performed in a direction from the first select line to the second select line;
    performing a first discharge operation on first unselected word lines between the selected word line and the first select line after performing the verify operation; and
    performing a second discharge operation on second unselected word lines between the selected word line and the second select line after performing the first discharge operation.

15. The method according to claim 14, wherein the selected word line is discharged when the second unselected word lines are discharged.

16. The method according to claim 15, wherein all word lines are divided into a plurality of word line groups, each including at least one word line,
    the word line groups are sequentially discharged, and
    word lines included in an identical word line group are simultaneously discharged.

17. The method according to claim 16, wherein after word lines included in a word line group including the selected word line are discharged, the selected word line and word lines included in the word line group including the selected word line are simultaneously discharged.

18. The method according to claim 16, wherein, among the word line groups, different word line groups are designated to be discharged at regular time intervals or at gradually decreasing time intervals.

19. The method according to claim 14, wherein the verify operation is performed after a program operation is performed.

* * * * *